(12) United States Patent
Chen et al.

(10) Patent No.: US 12,009,467 B1
(45) Date of Patent: Jun. 11, 2024

(54) BACKLIGHT MODULES AND DISPLAY DEVICES

(71) Applicant: TCL CHINA STAR OPTOELECTRONICS TECHNOLOGY CO., LTD., Guangdong (CN)

(72) Inventors: Linnan Chen, Guangdong (CN); Hongzhao Deng, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/307,610

(22) Filed: Apr. 26, 2023

(30) Foreign Application Priority Data

Dec. 28, 2022 (CN) .......................... 202211697000.2

(51) Int. Cl.
   *H01L 33/62* (2010.01)
   *F21V 8/00* (2006.01)

(52) U.S. Cl.
   CPC ............ *H01L 33/62* (2013.01); *G02B 6/0073* (2013.01)

(58) Field of Classification Search
   CPC ............................. H01L 33/62; G02B 6/0073
   See application file for complete search history.

(56) References Cited

FOREIGN PATENT DOCUMENTS

| CN | 207882632 U | 9/2018 |
|---|---|---|
| CN | 109445210 A | 3/2019 |
| CN | 113009741 A | 6/2021 |
| CN | 114283706 A | 4/2022 |
| CN | 115084185 A | 9/2022 |
| CN | 115425046 A | 12/2022 |

OTHER PUBLICATIONS

Yao et al., CN 113471181, Oct. 2021 (Year: 2021).*
Xie, CN 112086037, Dec. 2020 (Year: 2020).*
Zhao, CN 115513222, Dec. 2022 (Year: 2022).*
Chinese Office Action issued in corresponding Chinese Patent Application No. 202211697000.2 dated Dec. 19, 2023, pp. 1-7.
Chinese Office Action issued in corresponding Chinese Patent Application No. 202211697000.2 dated Mar. 8, 2024, pp. 1-5.

* cited by examiner

*Primary Examiner* — Mary Ellen Bowman
(74) *Attorney, Agent, or Firm* — PV IP PC; Zhigang Ma; Wei Te Chung (57) ABSTRACT

A backlight module includes a light source module, a binding terminal unit, a plurality of first signal wires disposed in a same layer and spaced apart, and a plurality of signal connection wires. The plurality of first signal wires are disposed to correspond to a plurality of binding terminal parts of the binding terminal unit one-to-one. Each of the first signal wires is configured to connect a first binding terminal of one of the binding terminal parts with one light source unit of the light source module. In adjacent two of binding terminal parts, one of the first signal wires corresponding to one of adjacent two of the binding terminal parts is connected to one of the first signal wires corresponding to another one of the adjacent two of the binding terminal parts through one of the signal connection wires.

20 Claims, 3 Drawing Sheets

BACKLIGHT MODULES AND DISPLAY DEVICES

CROSS-REFERENCE TO RELATED APPLICATION

This application claims priority to and the benefit of Chinese Patent Application No. 202211697000.2, filed on Dec. 28, 2022, the disclosure of which is incorporated herein by reference in its entirety.

TECHNICAL FIELD

The present disclosure relates to display technologies, and in particular, to backlight modules and display devices.

BACKGROUND

A display technology of micro light-emitting diodes (Micro LEDs) has become one of hotspots in future display technology due to its advantages such as wide color gamut, high contrast, and high brightness. Especially, by introducing local dimming technology in Micro LED backlight modules, ultra-high contrast has been achieved, making the black state reach the extreme and avoiding the phenomenon of light leakage or gray in the dark state. Glass-based Micro LEDs backlight modules have the advantages of large assembly size, good heat dissipation, and high flatness, making it a hot research direction for mainstream manufacturers.

In existing glass-based Micro LED displays, micro integrated circuits such as driver chips and light-emitting diodes are generally weld inside the backlight modules of display panels, so that a display mode of active driving without flicker at each sub-area of the backlight modules can be achieved through active-matrix (AM) driving of the micro integrated circuits. However, due to limitation of locations of the driver chips and signal wires, it is not possible to connect the driver chips and the signal wires one-to-one. In the related art, each of the signal wires is generally designed with double metal wires disposed in different layers, and via holes are designed at fan-out areas to achieve horizontal cross wire between the different layers, so as to solve the above-mentioned problems. However, the double metal wires have high production cost, and there is a risk of short circuits at locations where the metal wires in different layers connected to each other.

SUMMARY

An embodiment of the present disclosure provides a backlight module including a display area and a non-display area adjacent to the display area, and the backlight module includes:
- a light source module disposed at the display area and including a plurality of light source units arranged along a first direction;
- a binding terminal unit disposed at the non-display area and including a plurality of binding terminal parts arranged along the first direction, wherein the plurality of binding terminal parts are disposed to correspond to the plurality of light source units one-to-one, and each of the binding terminal parts includes a first binding terminal;
- a plurality of first signal wires disposed in a same layer and spaced apart, wherein the plurality of first signal wires are disposed to correspond to the plurality of binding terminal parts one-to-one, and each of the first signal wires is configured to connect the first binding terminal of one of the binding terminal parts with one of the light source units; and
- a plurality of signal connection wires disposed at the non-display area, wherein the signal connection wires and the first signal wires are disposed in a same layer;
- wherein in adjacent two of the binding parts, one of the first signal wires corresponding to one of the adjacent two of the binding terminal parts is connected to one of the first signal wires corresponding to another one of the adjacent two of the binding terminal parts through one of the signal connection wires.

In some embodiment of the present disclosure, adjacent number of the binding terminal parts form a binding terminal group, and the first signal wires corresponding to the binding terminal parts in a plurality of binding terminal groups are connected to each other.

In some embodiment of the present disclosure, in adjacent two of the binding parts, one end of one of the first signal wires corresponding to one of the adjacent two of the binding terminal parts is connected to the first binding terminal in the one of the adjacent two of the binding terminal parts, and another end of the one of the first signal wires corresponding to the one of the adjacent two of the binding terminal parts is connected to the first binding terminal in another one of the adjacent two of the binding terminal parts.

In some embodiment of the present disclosure, the plurality of binding terminal groups include a same number of binding terminal parts.

In some embodiment of the present disclosure, each of the binding terminal groups includes N binding terminal parts, and N is a positive integer greater than or equal to 2.

In some embodiment of the present disclosure, each of the binding terminal groups includes a first binding terminal part and a second binding terminal part arranged along the first direction, and both of the first binding terminal part and the second binding terminal part include the first binding terminals;
  wherein one end of one of the first signal wires corresponding to the first binding terminal part is connected to the first binding terminal of the first binding terminal part, and another end of the one of the first signal wires corresponding to the first binding terminal part is connected to the first binding terminal of the second binding terminal part; an end of one of the first signal wires corresponding to the second binding terminal part is connected to the first binding terminal of the second binding terminal part.

In some embodiment of the present disclosure, the binding terminal unit includes an auxiliary terminal located between adjacent two of the binding terminal parts;
  in adjacent two of the binding parts, one of the first signal wires corresponding to one of the adjacent two of the binding terminal parts is connected to one of the signal connection wires through the auxiliary terminal, and one of the first signal wires corresponding to another one of the adjacent two of the binding terminal parts is connected to the one of the signal connection wires through the first binding terminal in the another one of the adjacent two of the binding terminal parts.

In some embodiment of the present disclosure, each of the first signal wires includes a first signal sub-wire and a signal connection section connected sequentially;
  wherein the first signal sub-wire is disconnected to the signal connection wire, one end of the first signal sub-wire is connected to the first binding terminal, and another end of the first signal sub-wire is connected to one of the light source units; and wherein one end of the signal connection section is connected to the one of the light source units, and another end of the signal connection section is connected to an end of the auxiliary terminal.

In some embodiment of the present disclosure, the signal connection section extends along the first direction, and both of the first signal sub-wire and the second signal sub-wire extend along the second direction; the signal connection section has a length less than a length of the first signal sub-wire or a length of the second signal sub wire.

An embodiment of the present disclosure further provides a display device including a display panel and any of the above-mentioned backlight modules.

DETAILED DESCRIPTION

In combination with drawings in the embodiments of the present disclosure, technical solutions in the embodiments of the present disclosure will be described clearly and completely. Obviously, the described embodiments are only part of the embodiments of the present disclosure, not all of them. Based on the embodiments of the present disclosure, all other embodiments obtained by those skilled in the art without creative effort belong to a scope of the present disclosure. In addition, it should be understood that specific embodiments described herein are only used to explain and interpret the present disclosure and are not used to limit the present disclosure. In the present disclosure, location terms used, such as "up" and "down", generally refer to up and down in actual using or working state of devices, in particular drawing directions in the drawings, unless otherwise described; terms "inside" and "outside" refer to outlines of the devices.

Embodiments of the present disclosure provides a backlight module and a display device. The following will describe in detail. It should be noted that a description order of the following embodiments does not serve as a limitation on a preferred order of the embodiments.

Referring to FIG. 1 to FIG. 5, the present disclosure provides a backlight module 1, and the backlight module 1 includes a display area 1000 and a non-display area 2000 adjacent to the display area 1000. The backlight module 1 includes a light source module 10, a binding terminal unit 20, a plurality of first signal wires 31, and a plurality of signal connection wires 34. The light source module 10 is disposed at the display area 1000, and includes a plurality of light source units 100 arranged along a first direction X. The binding terminal unit 20 is disposed at the non-display area 2000, and includes a plurality of binding terminal parts 200 arranged along the first direction X. The plurality of binding terminal parts 200 are disposed to correspond to the plurality of light source units 100 one-to-one. Each of the binding terminal parts 200 includes a first binding terminal 210. The plurality of first signal wires 31 are disposed in a same layer and spaced apart, and disposed to correspond to the plurality of binding terminal parts 200 one-to-one. Each of the first signal wires 31 is configured to connect the first binding terminal 210 of one of the binding terminal parts 200 with one of the light source units 100. The plurality of signal connection wires 34 are disposed at the non-display area 2000, and disposed in a same layer as the first signal wires 31. In adjacent two binding parts 200, one of the first signal wires 31 corresponding to one of the adjacent two binding terminal parts 200 is connected to one of the first signal wires 31 corresponding to another one of the adjacent two binding terminal parts 200 through one of the signal connection wires 34.

It should be noted that by introducing local dimming technology in Micro LED backlight modules, ultra-high contrast has been achieved, making the black state reach the extreme and avoiding the phenomenon of light leakage or gray in the dark state. However, due to limitation of locations of driver chips and signal wires, it is not possible to connect the driver chips and the signal wires one-to-one. In the related art, each of the signal wires is generally designed with double metal wires disposed in different layers, and via holes are designed at fan-out areas to achieve horizontal cross wire between the different layers, so as to solve the above-mentioned problems. However, the double metal wires have high production cost, and there is a risk of short circuits at locations where metal wires in different layers connected to each other.

It can be understood that by designing any adjacent two binding terminal parts 200 and one of the first signal wires 31 corresponding to one of the adjacent two binding terminal parts 200 being connected to one of the first signal wires 31 corresponding to another one of the adjacent two binding terminal parts 200 through one of the signal connection wires 34, only a small amount of chips or even only one control chip is required to drive the plurality of light source units 100 to emit light. Meanwhile, since the first signal wires 31 are disposed to correspond to the binding terminal parts 200 one-to-one, and the first binding terminal 210 of one of the binding terminal parts 200 and one of the light source units 100 can be connected through one of the first signal wires 31, the light source units 100 can emit light based on signals transmitted by the first binding terminal 210. Compared to the related art, there is no need to open via holes at fan-out areas or the number of via holes can be reduced according to the backlight module 1 of the present disclosure, thereby reducing production cost. Moreover, due to a fact that the plurality of first signal wires 31 are disposed in the same layer and spaced apart, and disposed in the same layer as the signal connection wires 34, a risk of short circuits at locations where metal wires in different layers connected to each other can be avoided.

Figure 1:
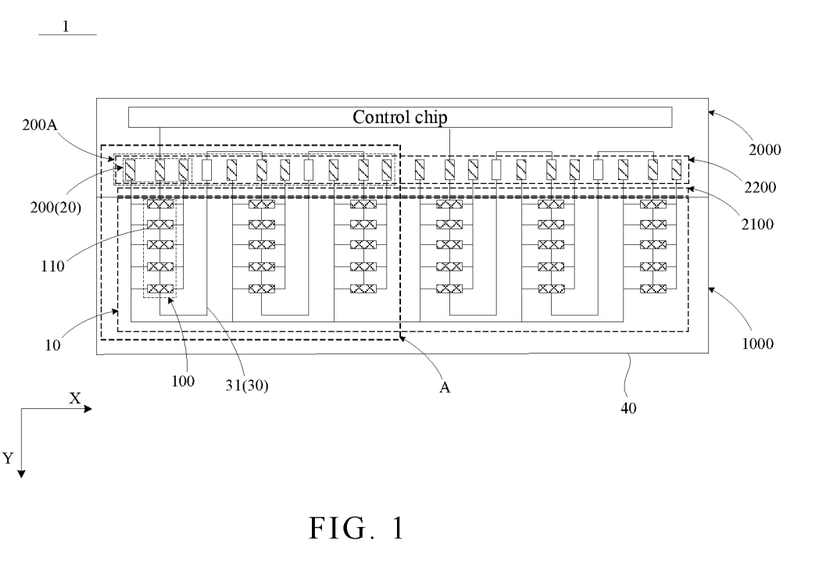
FIG. 1 is a first schematic structural diagram of a backlight module according to an embodiment of the present disclosure.
Figure 2:
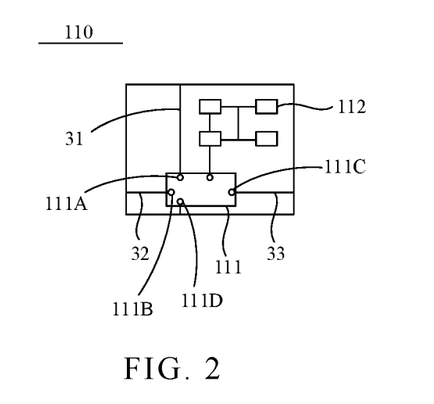
FIG. 2 is a schematic structural diagram of a light source section according to an embodiment of the present disclosure.
Figure 3:
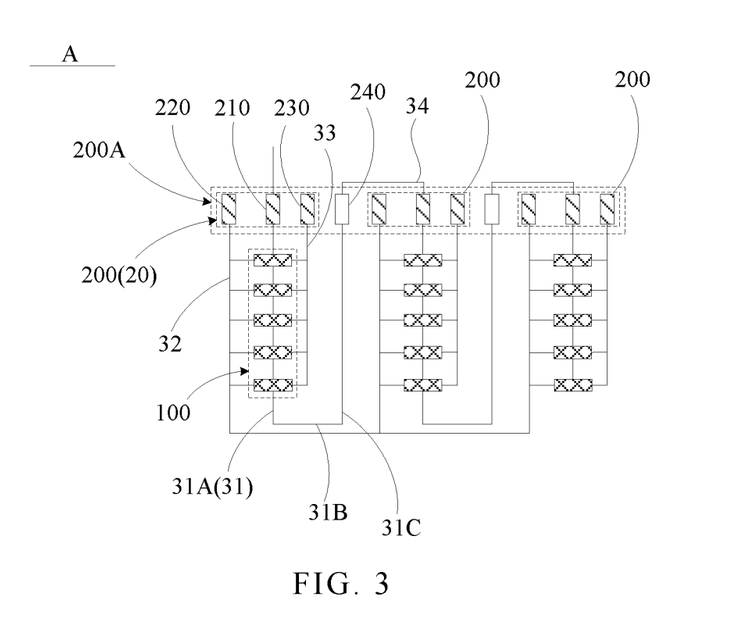
FIG. 3 is an enlarged diagram at a position A in FIG. 1.

In an embodiment, please refer to FIG. 1, FIG. 2, and FIG. 3. FIG. 1 is a first schematic structural diagram of the backlight module according to the embodiment of the present disclosure, FIG. 2 is a schematic structural diagram of a light source section according to the embodiment of the present disclosure, and FIG. 3 is an enlarged diagram at a position A in FIG. 1.

In the embodiment, the backlight module 1 includes the display area 1000 and the non-display area 2000 adjacent to the display area 1000. The non-display area 2000 includes a fan-out area 2100 and a binding area 2200, and the fan-out area 2100 is located between the binding area 2200 and the display area 1000. The backlight module 1 includes an insulating substrate 40, and the light source module 10, the binding terminal unit 20, and a first metal layer 30 located on the insulating substrate 40.

The insulating substrate 40 may be a flexible substrate or a rigid substrate. Specifically, when the insulating substrate 40 is the flexible substrate, a material of the insulating substrate 40 may include at least one of acrylic resin, methacrylic resin, polyisoprene, vinyl resin, epoxy resin, polyurethane resin, cellulose resin, siloxane resin, polyimide resin, and polyamide resin; when the insulating substrate 40 is the rigid substrate, the material of the insulating substrate 40 may include one of metal or glass.

The light source module 10 is disposed at the display area 1000, and includes the plurality of light source units 100 arranged along the first direction X. Each of the light source units 100 includes a plurality of light source sections 110 arranged along a second direction Y. Each of light source sections 110 includes a driver chip 111 and at least one light-emitting unit 112, and the light-emitting unit 112 includes but is not limited to a mini light-emitting diode. A preset angle is defined between the first direction X and the second direction Y.

Specifically, each of the light source sections 110 includes the driver chip 111 and a plurality of the light-emitting units 112 driven by the driver chip 111. Any adjacent two light-emitting units 112 can be connected in a series connection or in a parallel connection. The embodiment provides an example of the driver chip 111 capable of driving four light-emitting units 112 to illustrate a technical solution of the present disclosure. It can be understood that a quantity of the light-emitting units 112 which the driver chip 111 can control and a connection relationship between the light-emitting units 112 can be designed according to actual situation. This embodiment does not make specific limitations on them.

It should be noted that the embodiment does not impose specific limitations on the first direction X, the second direction Y, and the preset angle defined between the first direction X and the second direction Y However, for convenience of description, the embodiment takes the first direction X as a horizontal direction, the second direction Y as a vertical direction, and the preset angle being 90 degrees as examples to illustrate a technical solution of the present disclosure.

The binding terminal unit 20 is disposed at the binding area 2200, and includes the plurality of binding terminal parts 200 arranged along the first direction X. The binding terminal parts 200 are disposed to correspond to the light source units 100 one-to-one. Each of the binding terminal parts 200 includes the first binding terminal 210.

Specifically, each of the binding terminal parts 200 includes the first binding terminal 210 configured to transmit a digital image processing (DIP) signal, a second binding terminal 220 configured to transmit a grounding (GND) signal, and a third binding terminal 230 configured to transmit a power signal for driving light-emitting diodes to emit light. The second binding terminal 220, the first binding terminal 210, and the third binding terminal 230 are arranged in sequence along the first direction X. In some embodiments, each of the binding terminal parts 200 may also include a binding terminal configured to transmit a volt current condenser (VCC) signal and a binding terminal configured to transmit a data signal, etc.

The first metal layer 30 includes the plurality of first signal wires 31 spaced apart. Each of the first signal wires 31 is disposed to correspond to one of the binding terminal parts 200. The first signal wires 31 are configured to connect the first binding terminal 210 of one of the binding terminal parts 200 with one of the light source units 100.

Specifically, the backlight module 1 also includes a plurality of second signal wires 32 and a plurality of third signal wires 33. The first metal layer 30 includes a plurality of signal wires disposed in a same layer and spaced apart. Each of the signal wires includes one of the first signal wires 31, one of the second signal wires 32, and one of the third signal wires 33. Each of the first signal wires 31 is a DIP signal wire configured to transmit the DIP signal, each of the second signal wires 32 is a GND signal wire configured to transmit the GND signal, and each of the third signal wires 33 is a power signal wire configured to transmit the power signal. In each of the binding terminal parts 200, the first binding terminal 210 is connected to corresponding one of the light source units 100 through one of the first signal wires 31, the second binding terminal 220 is connected to corresponding one of the light source units 100 through one of the second signal wires 32, and the third binding terminal is connected to corresponding one of the light source units 100 through one of the third signal wires 33.

Furthermore, in each of the light source sections 110, the driver chip 111 includes a first signal pin 111A, a second signal pin 111B, and a third signal pin 111C. The first signal pin 111A is connected to the first binding terminal 210 through one of the first signal wires 31, the second signal pin 111B is connected to the second binding terminal 220 through one of the second signal wires 32, and the third signal pin 111C is connected to the third binding terminal 230 through one of the third signal wires 33. Because the first signal wires 31, the second signal wires 32, and the third signal wires 33 are disposed in the same layer, and the first binding terminal 210, the second binding terminal 220, and the third binding terminal 230 are electrically connected to the driver chip 111 through one of the first signal wires 31, one of the second signal wires 32, and one of the third signal wires 33, respectively, the light-emitting units 112 driven by the driver chip 111 can emit light based on signals transmitted by the above-mentioned binding terminals, thereby avoiding a risk of short circuits at locations where metal wires in different layers connected to each other.

Driver chips 111 of adjacent two light source sections 110 in any of the light source units 100 share one of the first signal wires 31, one of the second signal wires 32, and one of the third signal wires 33, so that the GND signal, the DIP signal and the power signal respectively transmitted by the first binding terminal 210, the second binding terminal 220, and the third binding terminal 230 are transmitted to one of the driver chips 111 of corresponding one of the light source units 100, respectively.

It should be noted that in adjacent two light source units 100, one of the second signal wires 32 corresponding to one of the adjacent two light source units 100 is connected to one of the second signal wires 32 corresponding to another one of the adjacent two light source units 100. That is, the plurality of light source units 100 jointly receive the GND signal. Moreover, the driver chip 111 also includes a fourth signal pin 111D configured to transmit the DIP signal. In adjacent two light source sections 110 in each of the light source units 100, the DIP signal outputted by the fourth signal pin 111D of the driver chip 111 in one of the adjacent two light source sections 110 and the DIP signal inputted by the fourth signal pin 111D of the driver chip 111 in another one of the adjacent two light source sections 110 are same signals.

Furthermore, in the embodiment, in adjacent two binding terminal parts 200, one of the first signal wires 31 corresponding to one of the adjacent two binding terminal parts 200 is connected to one of the first signal wires 31 corresponding to another one of the adjacent two binding terminal parts 200, so that only a small amount or even one control chip is required to drive the plurality of light source units 100 to emit light. Moreover, a meander line structure can be designed to achieve an interconnection between one of the first signal wires 31 corresponding to one of adjacent two binding terminal parts 200 and one of the first signal wires 31 corresponding to another one of the adjacent two binding terminal parts 200, rather than adopting a method of designing via holes and horizontal cross wires. Therefore, compared to the related art, there is no need to open vias or the number of vias can be reduced, thereby reducing production cost.

Specifically, in the embodiment, adjacent number of the binding terminal parts 200 form a binding terminal group 200A, and the first signal wires 31 corresponding to the binding terminal parts 200 in one binding terminal group 200A are connected to each other.

Furthermore, in the embodiment, in adjacent two binding terminal parts 200, one end of one of the first signal wires 31 corresponding to one of the adjacent two binding terminal parts 200 is connected to the first binding terminal 210 of the one of the adjacent two binding terminal parts 200, and another end of the one of the first signal wires 31 corresponding to the one of the adjacent two binding terminal parts 200 is connected to the first binding terminal 210 of another one of the adjacent two binding terminal parts 200. That is, in the embodiment, adjacent two first signal wires 31 can be connected through the first binding terminal 210, thereby reducing a quantity of channels of signal wires.

Preferably, in the embodiment, a plurality of binding terminal groups 200 A include the same number of binding terminal parts 200. Since the binding terminal parts 200 are disposed to correspond to the light source units 100 one-to-one, by designing the plurality of binding terminal groups 200 A including the same number of the binding terminal parts 200, each of the binding terminal groups 200A can be designed to correspond to a same number of the light-emitting units 112, thereby effectively improving uniformity of light emitted by the backlight module 1.

Furthermore, in the embodiment, each of the binding terminal groups 200A includes N binding terminal parts 200, and N is a positive integer greater than or equal to 2. Preferably, N is equal to 3, that is, each of the binding terminal groups 200A includes three binding terminal parts 200.

In the embodiment, the binding terminal unit 20 includes an auxiliary terminal 240 located between adjacent two binding terminal parts 200. In adjacent two binding terminal parts 200, one of the first signal wires 31 corresponding to one of the adjacent two binding terminal parts 200 is connected to one of the signal connection wires 34 through the auxiliary terminal 240, and one of the first signal wires 31 corresponding to another one of the adjacent two binding terminal parts 200 is connected to the one of the signal connection wires 34 through the first binding terminal 210 of the another one of the adjacent two binding terminal parts 200.

It can be understood that a connection between adjacent two first signal wires 31 according to the embodiment can be achieved by a design of the auxiliary terminal 240, and stability of the connection between the adjacent two of the first signal wires 31 can be improved. Moreover, the auxiliary terminal 240 and the first binding terminal 210 can be disposed in a same layer to simplify a manufacturing process.

Specifically, in the embodiment, each of the first signal wires 31 includes a first signal sub-wire 31A and a signal connection section 31B connected to each other. The first signal sub-wire 31A is disconnected to the signal connection wire 34. One end of the first signal sub-wire 31A is connected to the first binding terminal 210, and another end of the first signal sub-wire 31A is connected to one of the light source units 100. One end of the signal connection section 31B is connected to one of the light source units 100, and another end of the signal connection section 31B is connected to an end of the auxiliary terminal 240.

In the embodiment, each of the first signal wires 31 also includes a second signal sub-wire 31C which is disconnected to the first signal sub-wire 31A. The signal connection section 31B is connected to the auxiliary terminal 240 through the second signal sub-wire 31C. That is, in the embodiment, one end of the signal connection section 31B is connected to the first signal sub-wire 31A, another end of the signal connection section 31B is connected to an end of the second signal sub-wire 31C, and another end of the second signal sub-wire 31C is connected to a side of the auxiliary terminal 240. Therefore, the signal connection section 31B and the second signal sub-wire 31C can form a meander line structure, so as to achieve an interconnection between one of the first signal wires 31 corresponding to one of adjacent two binding terminal parts 200 and one of the first signal wires 31 corresponding to another one of the adjacent two binding terminal parts 200, rather than adopting a method of designing the via holes and the horizontal cross wires. Compared to the related art, there is no need to open via holes at fan-out areas or the number of via holes can be reduced according to the present disclosure, thereby reducing production cost.

It should be noted that in the embodiment, the signal connection section 31B extends along the first direction X, and both of the first signal sub-wire 31A and the second signal sub-wire 31C extend along the second direction Y. A length of the signal connection section 31B in the first direction X is less than a length of the first signal sub-wire 31A and a length of the second signal sub-wire 31C in the second direction Y. It can be understood that due to a fact that an area of the display area 1000 is far greater than an area of the non-display area 2000, both of the length of the first signal sub-wire 31A and the length of the second signal sub-wire 31C are far greater than the length of the signal connection section 31B, which can avoid excessive voltage drop caused by a design of the meander line structure, thereby ensuring stability of the backlight module 1.

Figure 4:
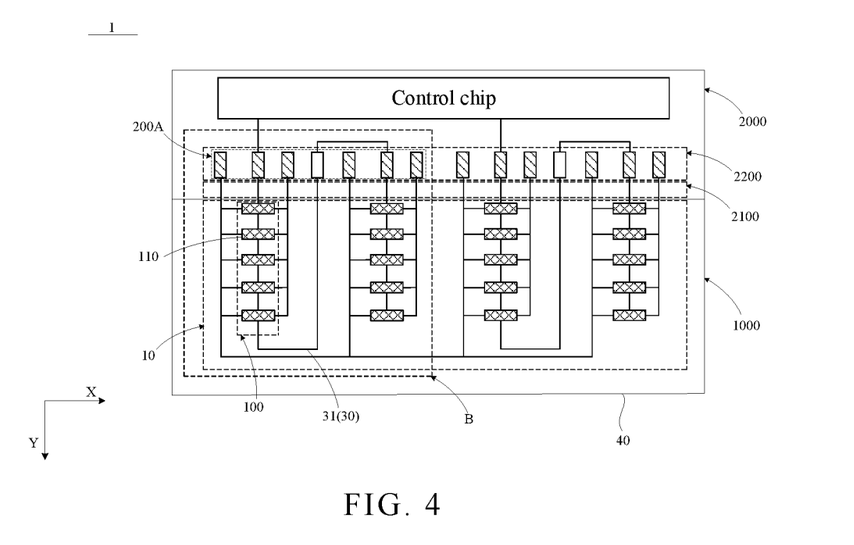
FIG. 4 is a second schematic structural diagram of the backlight module according to another embodiment of the present disclosure.
Figure 5:
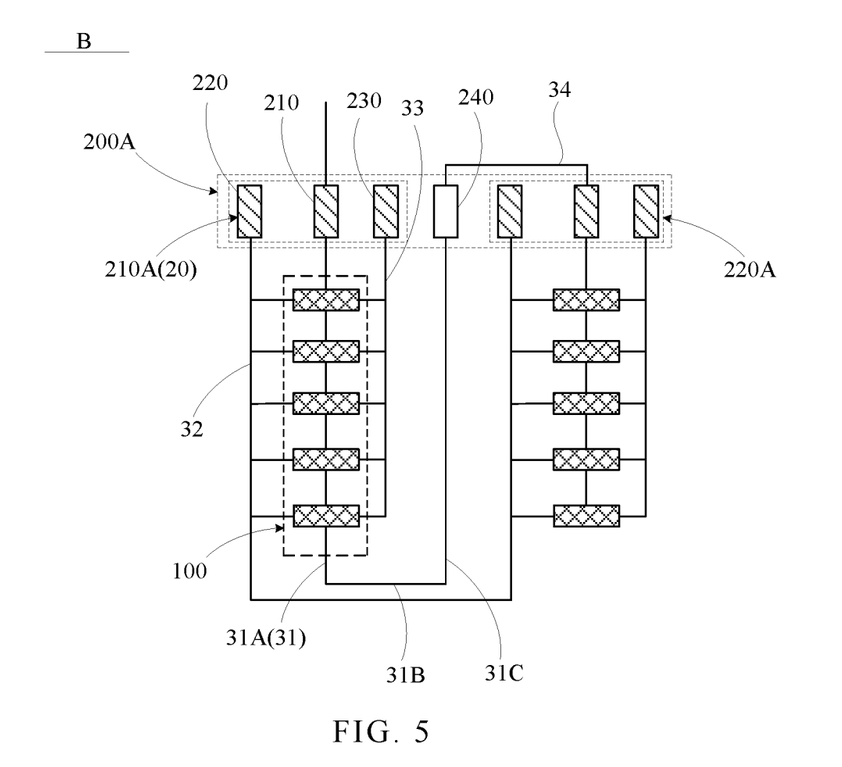
FIG. 5 is an enlarged diagram at a position B in FIG. 4.

It should be noted that each of the binding terminal groups 200A including three binding terminal parts 200 is only for illustrative purposes in the embodiment, and a specifically number of the binding terminal parts 200 included in each of the binding terminal groups 200A is not limited in the embodiment. For example, please refer to FIG. 4 and FIG. 5, FIG. 4 is a second schematic structural diagram of a backlight module according to another embodiment of the present disclosure, and FIG. 5 is an enlarged diagram at a position B in FIG. 4.

Each of the binding terminal groups 200A includes a first binding terminal part 210A and a second binding terminal part 220A arranged along the first direction X. Both of the first binding terminal part 210A and the second binding terminal part 220A include the first binding terminals 210. One end of one of the first signal wires 31 corresponding to the first binding terminal part 210A is connected to the first binding terminal 210 of the first binding terminal part 210A, another end of the one of the first signal wires 31 corresponding to the first binding terminal part 210A is connected to the first binding terminal 210 of the second binding terminal part 220A, and an end of one of the first signal wires 31 corresponding to the second binding terminal part 220A is connected to the first binding terminal 210 of the second binding terminal part 220A. It can be understood that a number of the binding terminal parts 200 included in one of the binding terminal groups 200A can be selected based on actual loading capacity of a control chip in the embodiment, and is not limited in the embodiment.

An embodiment of the present disclosure provides a display device, the display device includes a display panel and a backlight module described in any of the above-mentioned embodiments, and the backlight module is located on a back surface of the display panel.

It can be understood that the backlight module has been described in detail in the above-mentioned embodiments and will not be repeated here.

In specific applications, the display device can be a display screen applied to a device such as an intelligent mobile phone, a tablet, a laptop, an intelligent wristband, an intelligent watch, an intelligent glass, an intelligent helmet, a desktop computer, an intelligent television, or a digital camera, and can even be applied to an electronic device including a flexible display screen.

Present disclosure provides the backlight module and the display device including the backlight module. In the backlight module, by designing adjacent two binding terminal parts and one of the first signal wires corresponding to one of adjacent two binding terminal parts being connected to one of the first signal wires corresponding to another one of the adjacent two binding terminal parts through one of the signal connection wires, only a small amount or even only one control chip is required to drive a plurality of the light source units to emit light. Meanwhile, by designing the signal connection wires and the first signal wires being disposed in the same layer, the plurality of first signal wires being disposed in the same layer and spaced apart, the plurality of first signal wires being disposed to correspond to the plurality of binding terminal parts one-to-one, and each of the first signal wires being configured to connect the first binding terminal of one of the binding terminal parts with one of the light source units, the light source units can emit light based on signals transmitted by the first binding terminal. Compared to the related art, there is no need to open via holes at fan-out areas or the number of via holes can be reduced according to the present disclosure, thereby reducing production cost.

The backlight module and the display device provided by the embodiments of the present disclosure are described in detail. In this paper, specific embodiments are adopted to illustrate a principle and implementation modes of the present disclosure. The description of the above-mentioned embodiments is only used to help understand methods and a core idea of the present disclosure. At the same time, for those skilled in the art, there may be changes in specific implementation modes and the scope of the present disclosure according to the idea of the present disclosure. In conclusion, contents of the specification should not be interpreted as a limitation of the present disclosure.

What is claimed is:

1. A backlight module, comprising a display area and a non-display area adjacent to the display area, wherein the backlight module comprises:
   a light source module disposed at the display area and comprising a plurality of light source units arranged along a first direction;
   a binding terminal unit disposed at the non-display area and comprising a plurality of binding terminal parts arranged along the first direction, wherein the plurality of binding terminal parts are disposed to correspond to the plurality of light source units one-to-one, and each of the binding terminal parts comprises a first binding terminal;
   a plurality of first signal wires disposed in a same layer and spaced apart, wherein the plurality of first signal wires are disposed to correspond to the plurality of binding terminal parts one-to-one, and each of the first signal wires is configured to connect the first binding terminal of one of the binding terminal parts with one of the light source units; and
   a plurality of signal connection wires disposed at the non-display area, wherein the signal connection wires and the first signal wires are disposed in a same layer;
   wherein in adjacent two of the binding parts, one of the first signal wires corresponding to one of the adjacent two of the binding terminal parts is connected to one of the first signal wires corresponding to another one of the adjacent two of the binding terminal parts through one of the signal connection wires.

2. The backlight module of claim 1, wherein adjacent number of the binding terminal parts form a binding terminal group, and the first signal wires corresponding to the binding terminal parts in a plurality of binding terminal groups are connected to each other.

3. The backlight module of claim 1, wherein in adjacent two of the binding parts, one end of one of the first signal wires corresponding to one of the adjacent two of the binding terminal parts is connected to the first binding terminal in the one of the adjacent two of the binding terminal parts, and another end of the one of the first signal wires corresponding to the one of the adjacent two of the binding terminal parts is connected to the first binding terminal in another one of the adjacent two of the binding terminal parts.

4. The backlight module of claim 2, wherein the plurality of the binding terminal groups comprise a same number of binding terminal parts.

5. The backlight module of claim 2, wherein each of the binding terminal groups comprises N binding terminal parts, and N is a positive integer greater than or equal to 2.

6. The backlight module of claim 5, wherein each of the binding terminal groups comprises a first binding terminal part and a second binding terminal part arranged along the first direction, and both of the first binding terminal part and the second binding terminal part comprise the first binding terminals;
   wherein one end of one of the first signal wires corresponding to the first binding terminal part is connected to the first binding terminal of the first binding terminal part, and another end of the one of the first signal wires corresponding to the first binding terminal part is connected to the first binding terminal of the second binding terminal part; an end of one of the first signal wires corresponding to the second binding terminal part is connected to the first binding terminal of the second binding terminal part.

7. The backlight module of claim 1, wherein the binding terminal unit comprises an auxiliary terminal located between adjacent two of the binding terminal parts;

in adjacent two of the binding parts, one of the first signal wires corresponding to one of the adjacent two of the binding terminal parts is connected to one of the signal connection wires through the auxiliary terminal, and one of the first signal wires corresponding to another one of the adjacent two of the binding terminal parts is connected to the one of the signal connection wires through the first binding terminal in the another one of the adjacent two of the binding terminal parts.

8. The backlight module of claim 7, wherein each of the first signal wires comprises a first signal sub-wire and a signal connection section connected sequentially;

wherein the first signal sub-wire is disconnected to the signal connection wire, one end of the first signal sub-wire is connected to the first binding terminal, and another end of the first signal sub-wire is connected to one of the light source units; and wherein one end of the signal connection section is connected to the one of the light source units, and another end of the signal connection section is connected to an end of the auxiliary terminal.

9. The backlight module of claim 8, wherein each of the first signal wires further comprises a second signal sub-wire which is disconnected to the first signal sub-wire; and the signal connection section is connected to the auxiliary terminal through the second signal sub-wire.

10. The backlight module of claim 9, wherein the signal connection section extends along the first direction, and both of the first signal sub-wire and the second signal sub-wire extend along the second direction; the signal connection section has a length less than a length of the first signal sub-wire or a length of the second signal sub wire.

11. The backlight module of claim 1, wherein the first binding terminal is configured to transmit a digital image processing signal; each of the binding terminal parts further comprises a second binding terminal configured to transmit a ground signal and a third binding terminal configured to transmit a power signal; and the second binding terminal, the first binding terminal, and the third binding terminal are arranged in sequence along the first direction.

12. The backlight module of claim 11, wherein the backlight module further comprises a plurality of second signal wires and a plurality of third signal wires; the first binding terminal is connected to corresponding one of the light source units through one of the first signal wires, the second binding terminal is connected to corresponding one of the light source units through one of the second signal wires, and the third binding terminal is connected to corresponding one of the light source units through one of the third signal wires.

13. The backlight module of claim 12, wherein each of the light source units comprises a plurality of light source sections arranged along the second direction, and each of the light source sections comprises a driver chip and at least one light-emitting unit;

wherein the driver chip comprises a first signal pin, a second signal pin, and a third signal pin; the first signal pin is connected to the first binding terminal through one of the first signal wires, the second signal pin is connected to the second binding terminal through one of the second signal wires, and the third signal pin is connected to the third binding terminal through one of the third signal wires.

14. The backlight module of claim 13, wherein the driver chip further comprises a fourth signal pin configured to transmit the digital image processing signal, the digital image processing signal outputted by the fourth signal pin of the driver chip in one of adjacent two of the light source sections and the digital image processing signal inputted by the fourth signal pin of the driver chip in another one of the adjacent two of the light source sections are same signals.

15. The backlight module of claim 12, wherein each of the light source units comprises a plurality of light source sections arranged along the second direction, and each of the light source sections comprises a driver chip and at least one light-emitting unit;

wherein a plurality of driver chips of adjacent two of the light source sections in one of the light source units share a same one of the first signal wires, one of the second signal wires, and one of the third signal wires.

16. A backlight module, comprising a display area and a non-display area adjacent to the display area, wherein the backlight module comprises:

a light source module disposed at the display area and comprising a plurality of light source units arranged along a first direction;

a binding terminal unit disposed at the non-display area and comprising a plurality of binding terminal parts arranged along the first direction, wherein the plurality of binding terminal parts are disposed to correspond to the plurality of light source units one-to-one, and each of the binding terminal parts comprises a first binding terminal;

a plurality of first signal wires disposed in a same layer and spaced apart, wherein the plurality of first signal wires are disposed to correspond to the plurality of binding terminal parts one-to-one, and each of the first signal wires is configured to connect the first binding terminal of one of the binding terminal parts with one of the light source units; and a plurality of signal connection wires disposed at the non-display area, wherein the signal connection wires and the first signal wires are disposed in a same layer;

wherein in adjacent two of the binding parts, one of the first signal wires corresponding to one of the adjacent two of the binding terminal parts is connected to one of the first signal wires corresponding to another one of the adjacent two of the binding terminal parts through one of the signal connection wires;

wherein adjacent number of the binding terminal parts form a binding terminal group, and the first signal wires corresponding to the binding terminal parts in a plurality of binding terminal groups are connected to each other; and wherein the binding terminal unit comprises an auxiliary terminal located between adjacent two of the binding terminal parts; one of the first signal wires corresponding to one of the adjacent two of the binding terminal parts is connected to one of the signal connection wires through the auxiliary terminal, and one of the first signal wires corresponding to another one of the adjacent two of the binding terminal parts is connected to the one of the signal connection wires through the first binding terminal in the another one of the adjacent two of the binding terminal parts.

17. A display device, comprising a display panel and a backlight module defined with a display area and a non-display area adjacent to the display area, wherein the backlight module comprises:

a light source module disposed at the display area and comprising a plurality of light source units arranged along a first direction;

a binding terminal unit disposed at the non-display area and comprising a plurality of binding terminal parts arranged along the first direction, wherein the plurality of binding terminal parts are disposed to correspond to the plurality of light source units one-to-one, and each of the binding terminal parts comprises a first binding terminal;

a plurality of first signal wires disposed in a same layer and spaced apart, wherein the plurality of first signal wires are disposed to correspond to the plurality of binding terminal parts one-to-one, and each of the first signal wires is configured to connect the first binding terminal of one of the binding terminal parts with one of the light source units; and a plurality of signal connection wires disposed at the non-display area, wherein the signal connection wires and the first signal wires are disposed in a same layer;

wherein in adjacent two of the binding parts, one of the first signal wires corresponding to one of the adjacent two of the binding terminal parts is connected to one of the first signal wires corresponding to another one of the adjacent two of the binding terminal parts through one of the signal connection wires.

18. The display device of claim 17, wherein adjacent number of the binding terminal parts form a binding terminal group, and the first signal wires corresponding to the binding terminal parts in a plurality of binding terminal groups are connected to each other.

19. The display device of claim 17, wherein in adjacent two of the binding parts, one end of one of the first signal wires corresponding to one of the adjacent two of the binding terminal parts is connected to the first binding terminal in the one of the adjacent two of the binding terminal parts, and another end of the one of the first signal wires corresponding to the one of the adjacent two of the binding terminal parts is connected to the first binding terminal in another one of the adjacent two of the binding terminal parts.

20. The display device of claim 17, wherein the binding terminal unit comprises an auxiliary terminal located between adjacent two of the binding terminal parts;

in adjacent two of the binding parts, one of the first signal wires corresponding to one of the adjacent two of the binding terminal parts is connected to one of the signal connection wires through the auxiliary terminal, and one of the first signal wires corresponding to another one of the adjacent two of the binding terminal parts is connected to the one of the signal connection wires through the first binding terminal in the another one of the adjacent two of the binding terminal parts.

* * * * *